(12) United States Patent
Park et al.

(10) Patent No.: US 11,353,489 B2
(45) Date of Patent: Jun. 7, 2022

(54) ANTENNA PERFORMANCE TESTER

(71) Applicant: AMOTECH CO., LTD., Incheon (KR)

(72) Inventors: Jongho Park, Namwon-si (KR);
Hyungil Baek, Yongin-si (KR);
Chanwoo Lee, Yongin-si (KR)

(73) Assignee: AMOTECH CO., LTD., Incheon (KR)

( * ) Notice: Subject to any disclaimer, the term of this patent is extended or adjusted under 35 U.S.C. 154(b) by 0 days.

(21) Appl. No.: 17/277,660

(22) PCT Filed: Sep. 17, 2019

(86) PCT No.: PCT/KR2019/012004
§ 371 (c)(1),
(2) Date: Mar. 18, 2021

(87) PCT Pub. No.: WO2020/060160
PCT Pub. Date: Mar. 26, 2020

(65) Prior Publication Data
US 2022/0026479 A1    Jan. 27, 2022

(30) Foreign Application Priority Data
Sep. 19, 2018   (KR) .................... 10-2018-0112465

(51) Int. Cl.
*G01R 31/00*   (2006.01)
*G01R 29/08*   (2006.01)
*G01R 29/10*   (2006.01)

(52) U.S. Cl.
CPC ..... *G01R 29/0871* (2013.01); *G01R 29/0878* (2013.01); *G01R 29/105* (2013.01)

(58) Field of Classification Search
CPC ............ G01R 29/0821; G01R 29/0871; G01R 29/0878; G01R 29/0892; G01R 29/0864;
(Continued)

(56) References Cited

U.S. PATENT DOCUMENTS 10,470,009 B2 * 11/2019 Rowell .................. H04W 4/20
10,520,534 B1 * 12/2019 Rowell .................. G01R 29/10
(Continued)

FOREIGN PATENT DOCUMENTS

JP   S58-064804 A   4/1983
JP   2000-214201 A   8/2000
(Continued)

OTHER PUBLICATIONS

KR Office Action dated Aug. 18, 2019 as received in Application No. 10-2018-0112465.
(Continued)

*Primary Examiner* — Thang X Le
(74) *Attorney, Agent, or Firm* — Maschoff Brennan

(57) ABSTRACT

Disclosed is herein an antenna performance tester including: a horizontal rotor 200 rotatable about a shaft part 110 to which a DUT holder 300 is detachably coupled; and a vertical rotor 500 to which a reference antenna holder 400 is detachably fixed and which is spaced apart from a side surface of the DUT holder 300, is installed perpendicular to the horizontal rotor 200, and is rotatable about a virtual central point lying at the center. The antenna performance tester is advantageous in that: a reference antenna measures an RF while performing transmission and reception with respect to a DUT in all directions at a constant distance from the DUT; extension and replacement are possible depending on a frequency to be measured; and an influence of reflected waves is minimized at RF measurement, antenna performance can be simply tested in an anechoic chamber or even in a semi-anechoic chamber.

12 Claims, 9 Drawing Sheets

(58) Field of Classification Search
CPC ... G01R 29/0814; G01R 29/10; G01R 29/105
See application file for complete search history.

(56) References Cited

U.S. PATENT DOCUMENTS

| | | | | |
|---|---|---|---|---|
| 2014/0141726 A1* | 5/2014 | Schlub | ................. | G01R 29/105 |
| | | | | 455/67.12 |
| 2018/0287721 A1* | 10/2018 | Vikstedt | ............. | G01R 29/0878 |
| 2018/0321292 A1* | 11/2018 | Bartko | ............... | G01R 29/0821 |
| 2018/0323888 A1* | 11/2018 | Rowell | ............. | H04B 17/3912 |
| 2019/0025358 A1* | 1/2019 | Rowell | ............. | H04B 17/0085 |

FOREIGN PATENT DOCUMENTS

| | | |
|---|---|---|
| JP | 2001-133495 A | 5/2001 |
| JP | 2012-105144 A | 5/2012 |
| KR | 10-2009-0125577 A | 12/2009 |

OTHER PUBLICATIONS

KR Decision to Grant dated Feb. 7, 2020 as received in Application No. 10-2018-0112465.

* cited by examiner

[FIG. 1]
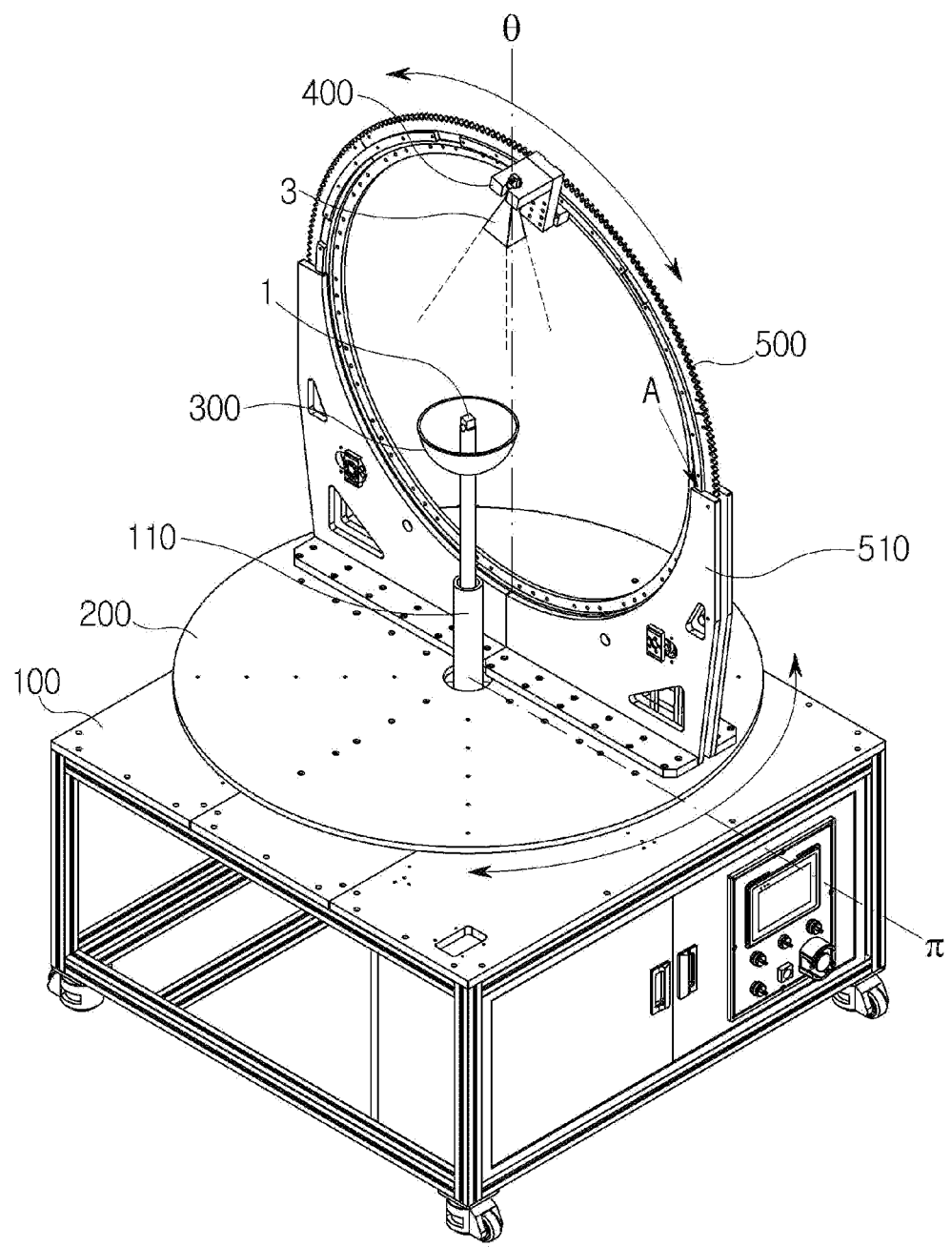

[FIG. 2]
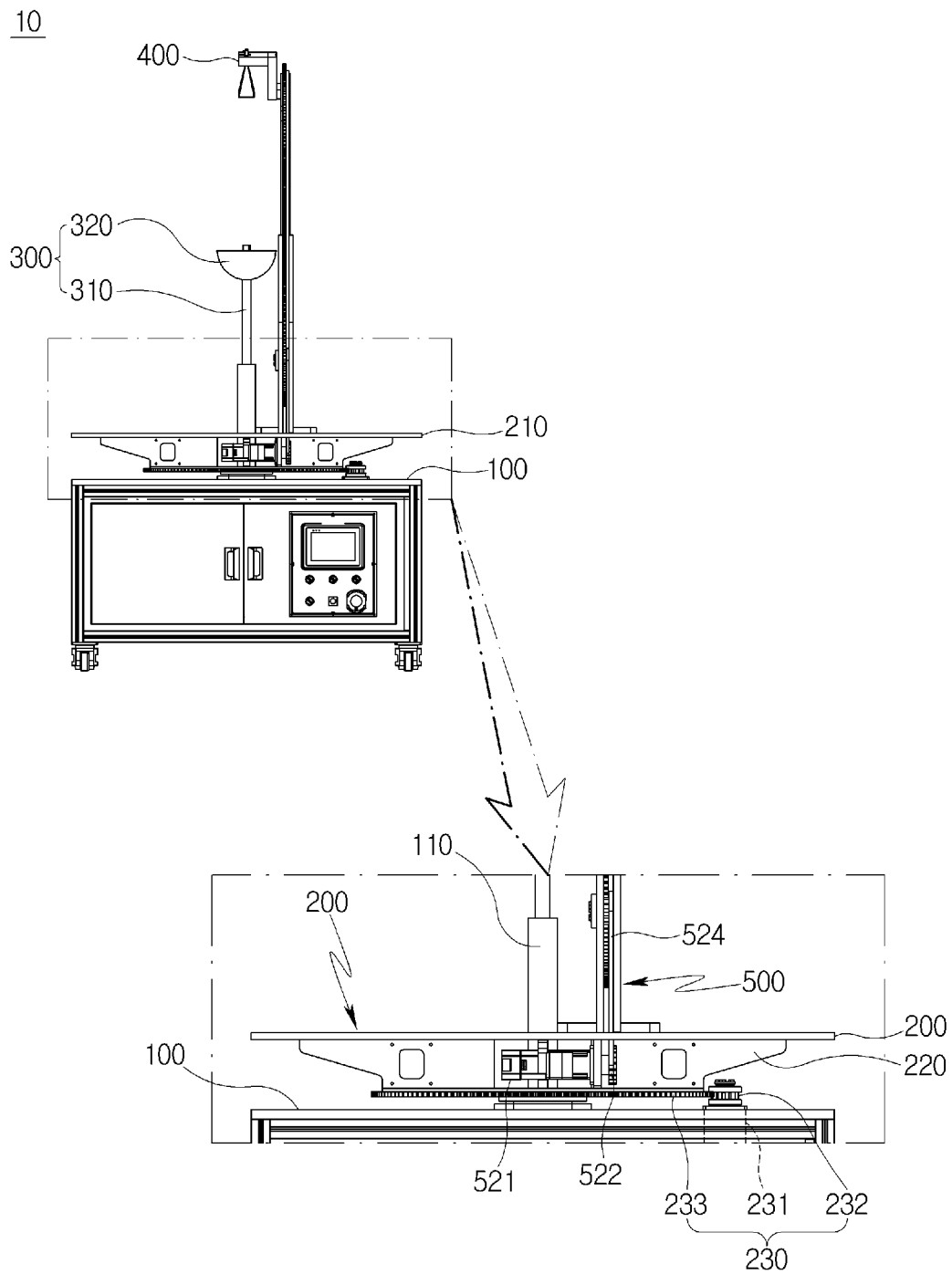

[FIG. 3]
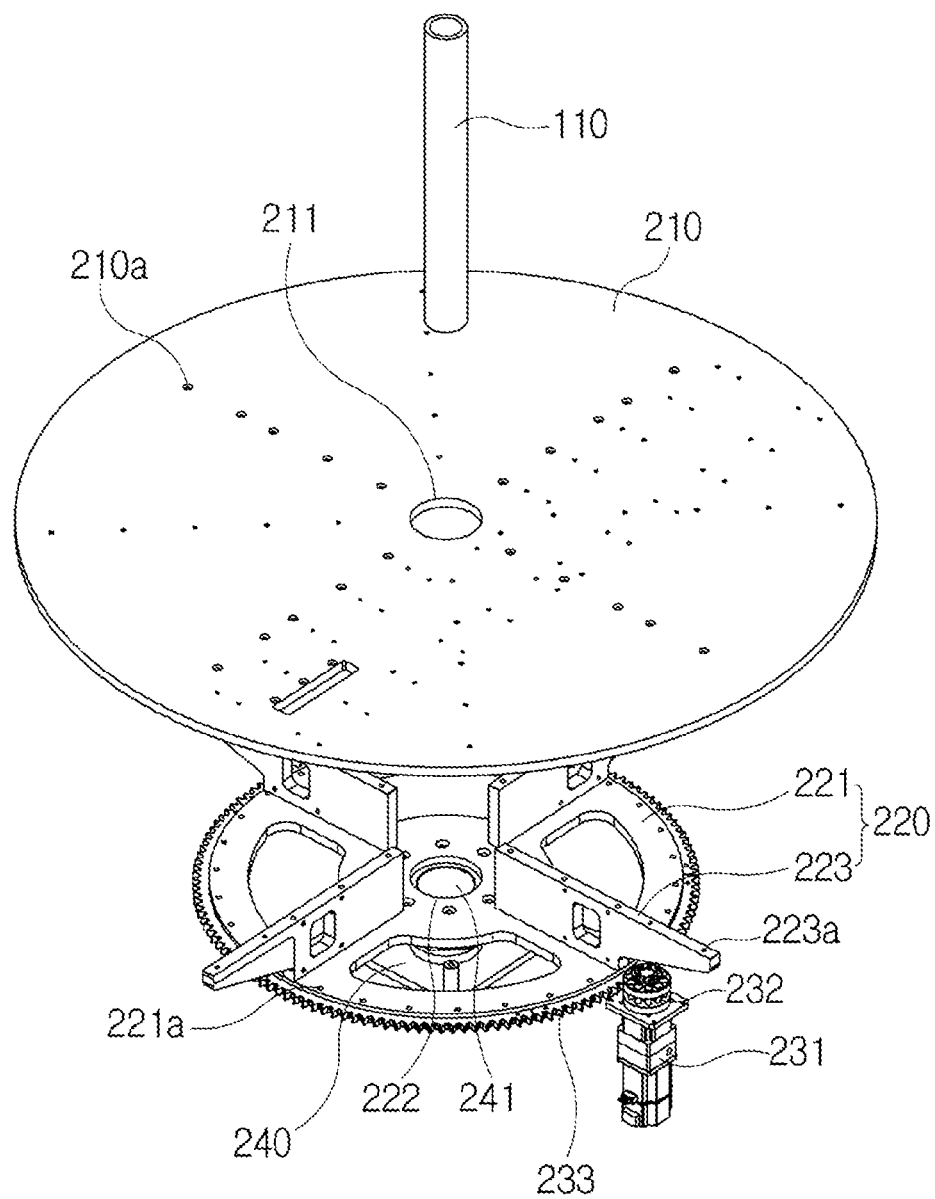

[FIG. 4]
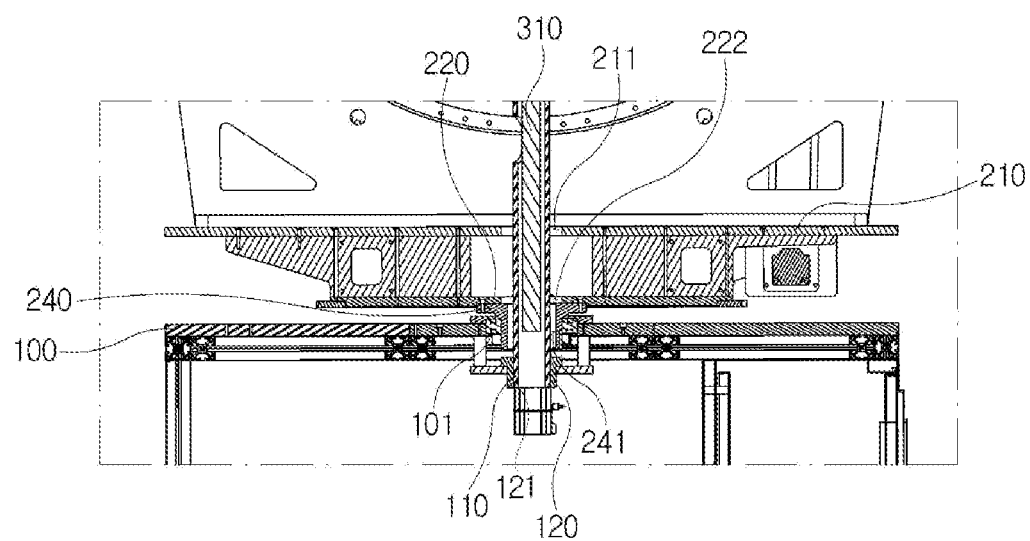

[FIG. 5]
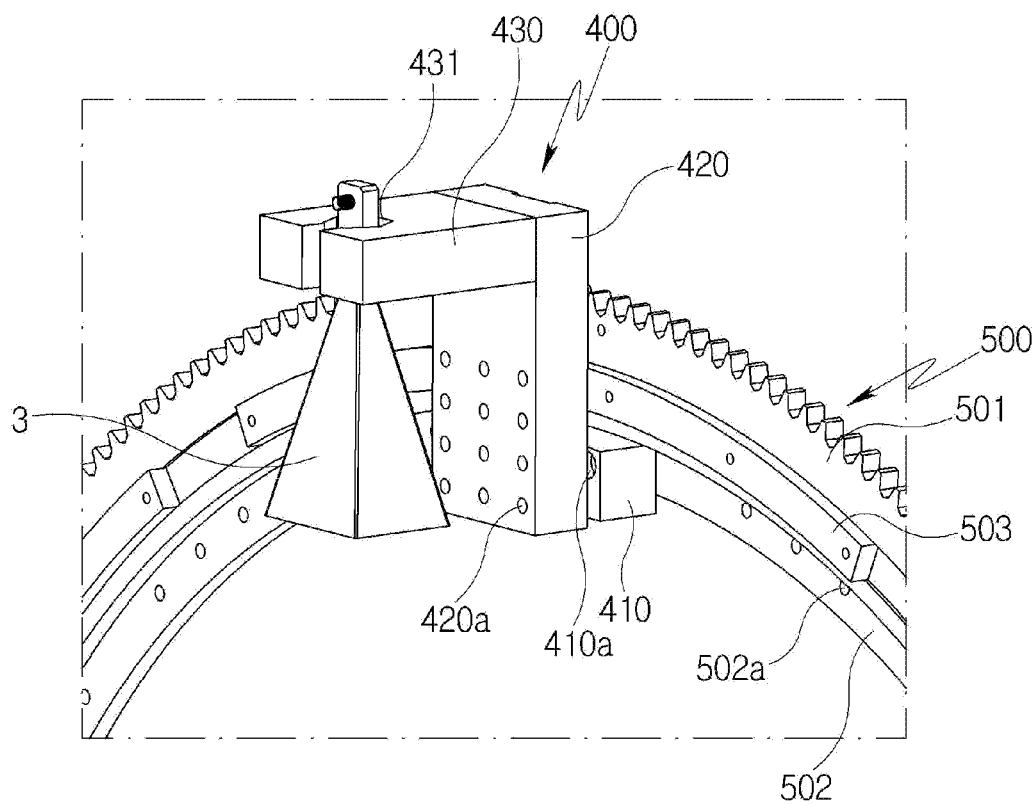

[FIG. 6]
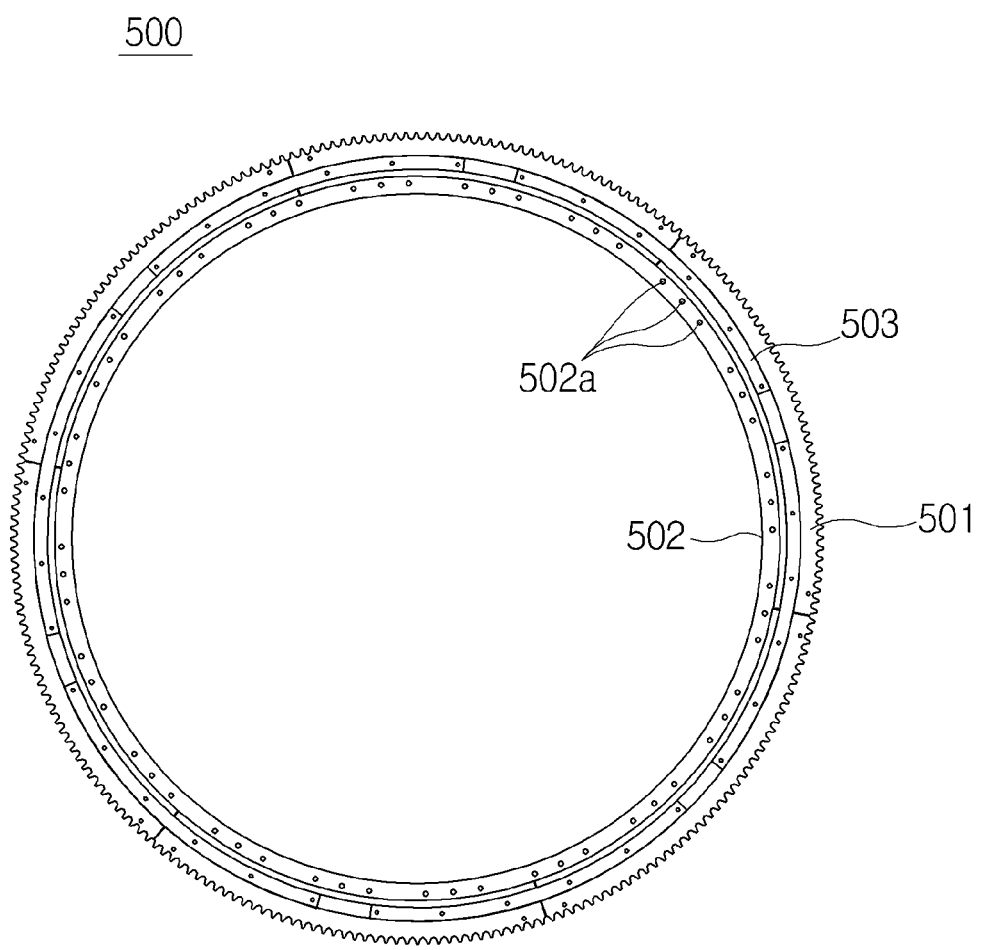

[FIG. 7]
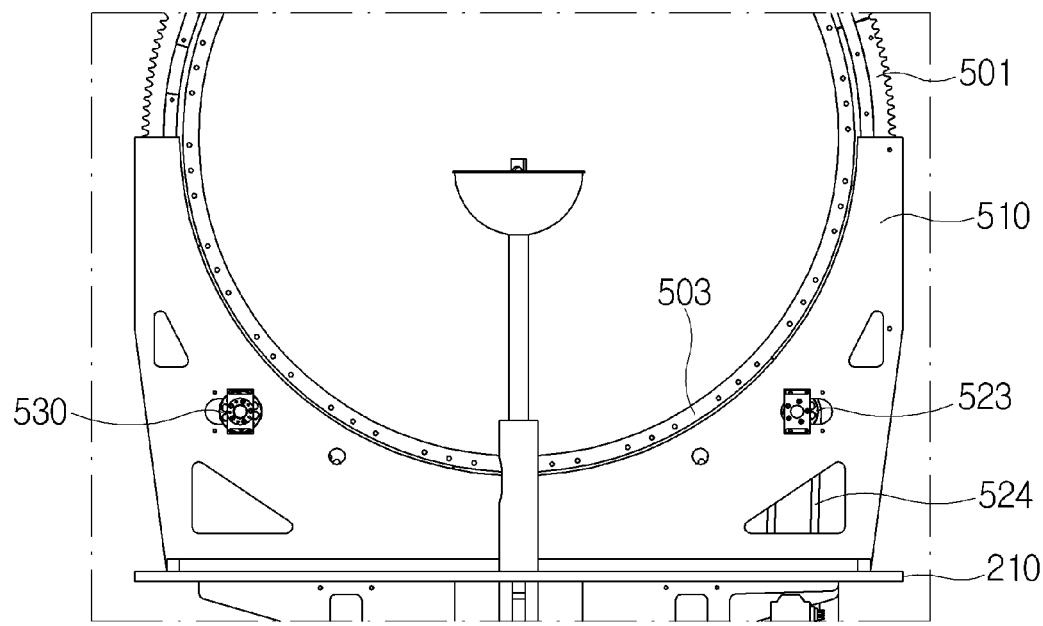
[FIG. 8]
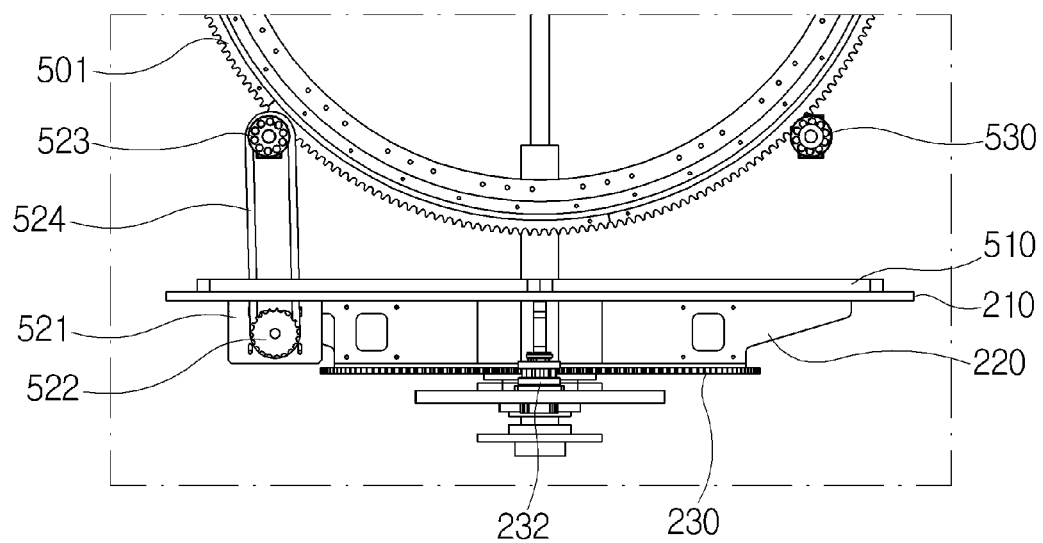

[FIG. 9]
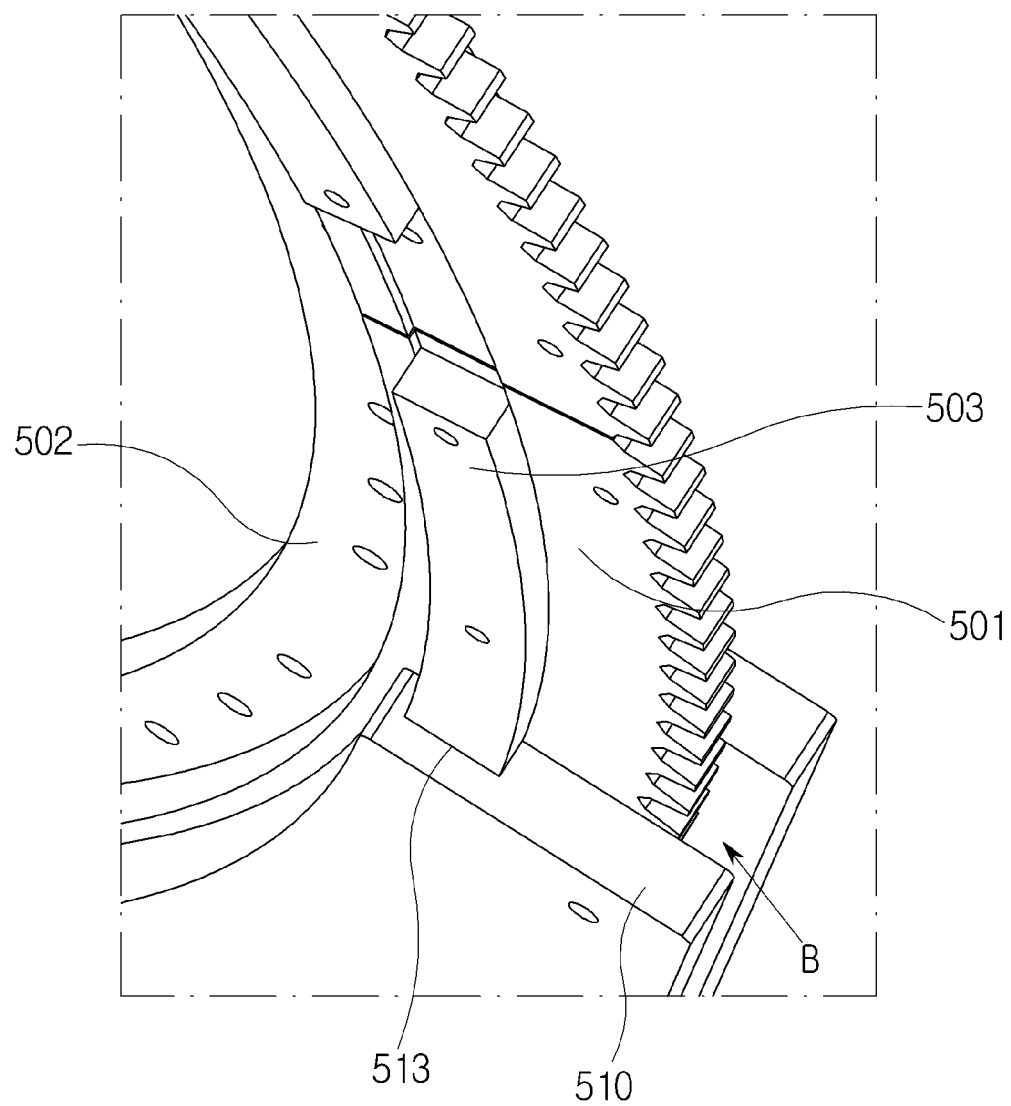

[FIG. 10]
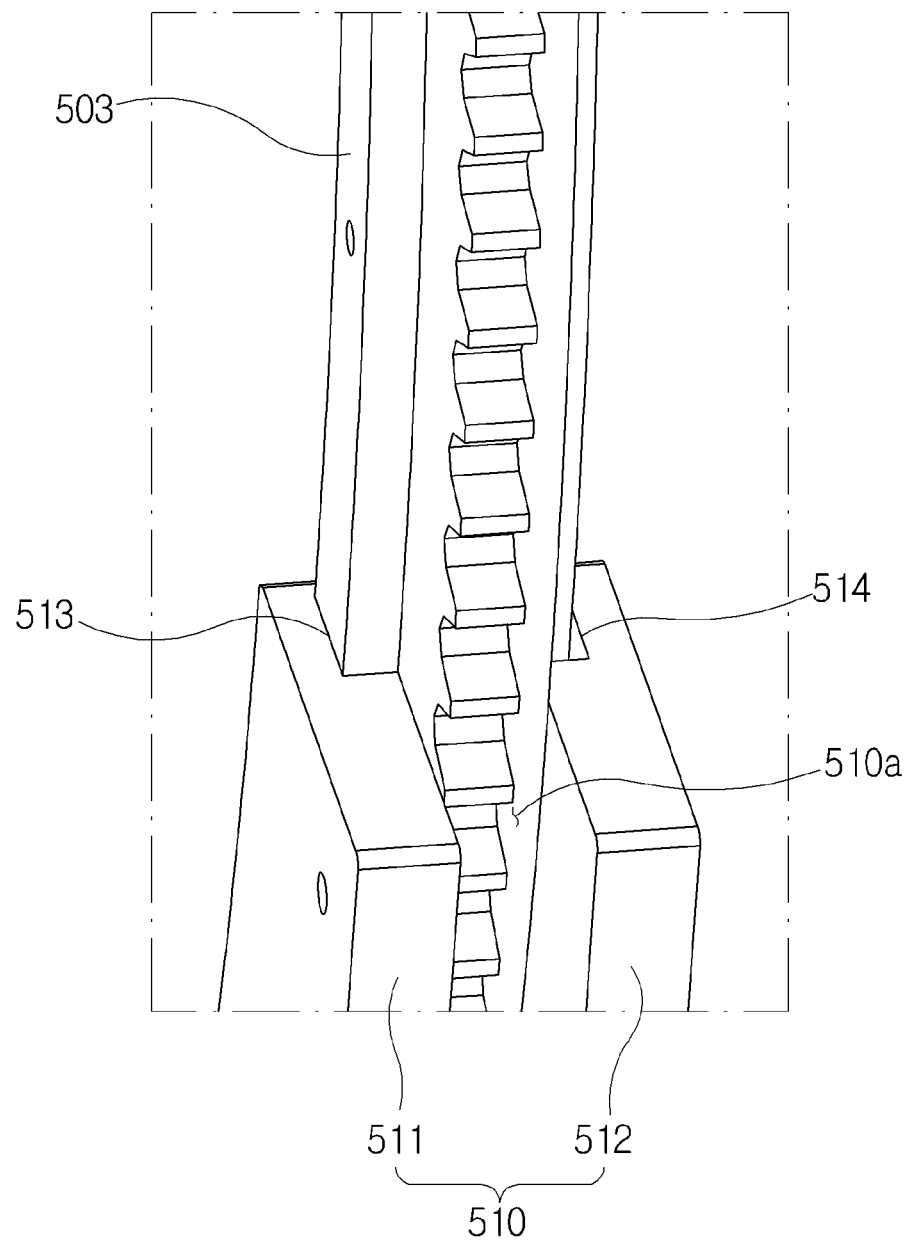

ANTENNA PERFORMANCE TESTER

TECHNICAL FIELD

The present disclosure relates to an antenna performance tester and, more particularly, to an antenna performance tester that is for measuring a gain of an antenna, equivalent isotropic radiated power (EIRP), and radiation pattern and is easily expanded.

BACKGROUND ART

With the development of technologies, a differentiated convergence service is rising in superhigh speed and low-delay fields based on wireless communication such as 5G, machine to machine (M2M), and Internet of thing (IoT), and devices realizing the differentiated convergence service are equipped with a plurality of antennas that satisfy specified conditions.

Thus, a demand for a chipset operating the plurality of antennas and a demand for test equipment for measuring and inspecting the chipset are increasing, and a demand for monitoring for measuring ultrahigh frequencies beyond existing BT and Wi-Fi bands and a demand for a measurement environment are being made.

However, since the existing equipment measures antenna performance in an anechoic chamber in which antenna radiation is performed, the existing equipment has a problem in that, due to high costs, it is difficult to install the existing equipment on small- and medium-sized firms or manufacturing fields. Further, the existing equipment has, for instance, a problem in that, due to different frequency standards for countries, multiple measurement environments resulting from the frequencies should be provided.

DISCLOSURE

Technical Problem

An objective of the present disclosure is to provide an antenna performance tester in which a reference antenna is disposed at a constant distance from a device under test in a 3-dimensional space, can measure an RF while performing transmission and reception with respect to the device under test in all directions (360 degrees), and in which accurate measurement of the RF is made possible in an anechoic chamber or even in a semi-anechoic chamber.

Further, another objective of the present disclosure is to provide an antenna performance tester that can be extended or replaced depending on a frequency of an antenna which is to be measured.

Technical Solution

According to features of the present disclosure for achieving the objectives as described above, an antenna performance tester of the present disclosure includes: a horizontal rotor which is installed at an upper portion of a base frame, is configured such that a shaft part is disposed in the center thereof, and is rotatable about the shaft part; a DUT holder detachably coupled to an upper portion of the shaft part and having a DUT held on an upper end thereof; a reference antenna holder on which a reference antenna for performing transmission and reception with respect to the DUT held on the DUT holder is held; and a vertical rotor to which the reference antenna holder is detachably fixed and which is spaced apart from a side surface of the DUT holder, is installed perpendicular to the horizontal rotor, and is rotatable about a virtual central point lying at the center thereof.

The horizontal rotor may include: a horizontal rotary plate in which a through-hole for disposing the shaft part is formed; a rotary plate support which is fixed to a lower portion of the horizontal rotary plate and in the center of which a fitting hole which communicates with the through-hole and into which the shaft part is fitted is formed; and a horizontal rotator for rotating the rotary plate support.

The horizontal rotator may include: a horizontal rotary motor; a pinion gear coupled to a shaft of the horizontal rotary motor, and a horizontal rotary gear provided to surround an outer diameter of the rotary plate support and meshed with the pinion gear.

The vertical rotor may be rotatably installed on a vertical support that is spaced apart from a side surface of the shaft part and is fixed to an upper surface of the horizontal rotor so as to be perpendicular to the horizontal rotor, and may be rotated by a vertical rotator.

The vertical rotor may include: a ring-shaped vertical rotary gear; a gear support provided to surround an inner diameter of the vertical rotary gear; and multiple gear reinforcements circumferentially provided on one surface of the vertical rotary gear at regular intervals.

The vertical support may include: first and second support plates which are spaced apart from each other, between which a disposition space in which the vertical rotor is rotatably disposed is formed, and which is formed to surround a part of the vertical rotary gear; and guide recesses formed in the first and second support plates so as to enable the gear reinforcements to move without interference during rotation of the vertical rotary gear.

The vertical rotator may include: a vertical rotary motor; a driving gear that is coupled to a shaft of the vertical rotary motor, a driven gear that has a central shaft coupled to the vertical support and is meshed with the vertical rotary gear; and a driving belt that connects the driving gear and the driven gear.

A load distribution gear may be disposed at a position opposite to the driven gear in symmetry with respect to a longitudinal central axis of the vertical rotary gear, and be meshed with the vertical rotary gear.

The driven gear and the load distribution gear may be disposed at an angle of 120° or less when intersecting a central point of the vertical rotary gear.

The reference antenna holder may include: a fastening part that is fixed to the vertical rotor by screwing; an extending part that is perpendicular to the fastening part and extends upward; and a holding part which is perpendicular to the extending part and in which a holding recess which extends in a direction opposite to the fastening part and in which the reference antenna is vertically held is formed.

Multiple reference antenna holders including the reference antenna holder may be fixable to the vertical rotor.

The shaft part may be configured to prevent rotation in such a way that an end thereof passes through the through-hole of the horizontal rotary plate and is fixed to a fixing plate fixed to a bottom of the base frame.

Advantageous Effects

The present disclosure has an effect in which, because a horizontal rotor is rotatable 360 degrees about a shaft part in a horizontal direction and a vertical rotor subordinate to the horizontal rotor is rotatable 360 degrees in a vertical direction, a reference antenna installed on the vertical rotor is rotatable 360 degrees by rotation of the vertical rotor and rotation of the horizontal rotor, and can measure an RF while performing transmission and reception with respect to a DUT in all directions at a constant distance from the DUT.

Further, the present disclosure has an effect in which a DUT holder, a reference antenna holder, a horizontal rotary plate, and a vertical rotor can be detached or attached, and thus extended and replaced depending on a frequency to be measured.

Further, the present disclosure has an effect in which components excluding motors are made of a nonmetallic material or an aluminum material, an influence of reflected waves when an RF is measured is minimized, and thus antenna performance can be simply tested in an anechoic chamber or even in a semi-anechoic chamber.

Therefore, the present disclosure has an effect in which, because antenna performance can be tested depending on a frequency using one device and be tested in an anechoic chamber or even in a semi-anechoic chamber, the antenna performance testing is easily applied in small- and medium-sized firms or manufacturing fields due to low test costs.

DESCRIPTION OF DRAWINGS

FIG. 1 is a perspective view illustrating an antenna performance tester according to an embodiment of the present disclosure.

FIG. 2 is a side view illustrating an antenna performance tester according to an embodiment of the present disclosure.

FIG. 3 is an exploded perspective view illustrating a horizontal rotor in an antenna performance tester according to an embodiment of the present disclosure.

FIG. 4 is a sectional view illustrating a horizontal rotor portion in an antenna performance tester according to an embodiment of the present disclosure.

FIG. 5 is a partial perspective view illustrating a reference antenna holder in an antenna performance tester according to an embodiment of the present disclosure.

FIG. 6 is a front view illustrating a vertical rotor in an antenna performance tester according to an embodiment of the present disclosure.

FIG. 7 is a view illustrating a state in which the vertical rotor is attached to the horizontal rotor in an antenna performance tester according to an embodiment of the present disclosure.

FIG. 8 is a view illustrating a horizontal rotator that rotates the vertical rotor in an antenna performance tester according to an embodiment of the present disclosure.

FIG. 9 is a view taken in a direction A of FIG. 1.

FIG. 10 is a view taken in a direction B of FIG. 9.

MODE FOR INVENTION

Hereinafter, embodiments of the present disclosure will be described in detail with reference to the attached drawings.

As illustrated in FIG. 1, an antenna performance tester of the present disclosure includes a horizontal rotor 200, a device under test (DUT) holder 300, a reference antenna holder 400, and a vertical rotor 500.

The horizontal rotor 200 is installed at an upper portion of a base frame 100. A shaft part 110 is disposed in the center of the horizontal rotor 200, and the horizontal rotor 200 is rotatable about the shaft part 110. In the drawings, the horizontal rotor 200 is rotatable 360 degrees about the shaft part 110 in a direction (a horizontal direction).

The base frame 100 is a fundamental frame for installing the horizontal rotor 200 and the vertical rotor 500. The horizontal rotor 200 may be rotatably installed on an upper surface of the base frame 100.

The DUT holder 300 is detachably coupled to an upper portion of the shaft part 110. The shaft part 110 may be formed in a hollow cylindrical shape, and the DUT holder 300 may be fitted to the upper portion of the shaft part 110.

A DUT is held at an upper end of the DUT holder 300. The DUT 1 may include a plurality of antennas as well as a chipset operating the antennas, or a computer electronic calculating device operating the antennas and the chipset. Further, the DUT 1 may be a directional antenna or a non-directional antenna.

The DUT holder 300 includes a fitting part 310 that is fitted into the shaft part 110, and a holding part 320 on which the DUT 1 is held. The fitting part 310 may has the shape of a pipe that is fitted into the shaft part 110, supports the holding part 320, and fixes the DUT 1.

The DUT holder 300 may be made in various shapes depending on a shape and type of the DUT 1, and is detachably coupled to the shaft part 110 so as to be replaceable depending on the DUT 1.

A shape of the DUT holder 300 can be changed depending on a condition of the DUT 1 to be measured. For example, when a radio frequency (RF) is to be measured by changing a distance between the DUT 1 and a reference antenna 3, the DUT holder 300 may be changed as corresponding to the condition.

The reference antenna 3 for performing transmission and reception with respect to the DUT 1 held on the DUT holder 300 is held on the reference antenna holder 400. The reference antenna 3 measures an RF which the DUT 1 transmits while performing transmission and reception with respect to the DUT 1. The reference antenna 3 may be a horn antenna. The horn antenna is a directional antenna that transmits an RF in a specified direction alone.

The reference antenna holder 400 is detachably fixed to the vertical rotor 500, and the vertical rotor 500 is spaced apart from a side surface of the DUT holder 300, is installed perpendicular to the horizontal rotor 200, and is rotatable about a virtual central point lying at the center thereof.

In the drawings, the vertical rotor 500 is rotatable 360 degrees about the virtual central point lying at the center thereof in a θ direction (a vertical direction). Here, the virtual central point lying at the center of the vertical rotor 500 is located on the same line as a position at which the DUT 1 is held on the DUT holder 300.

The reference antenna 3 performs transmission and reception with respect to the DUT 1 while facing the DUT 1.

Further, the reference antenna 3 may perform transmission and reception with respect to the DUT 1 while being rotated 360 degrees about the DUT 1 by the horizontal rotor 200 and the vertical rotor 500 in a horizontal direction and in a vertical direction, respectively. To this end, the reference antenna 3 is fixed to the vertical rotor 500 and faces the DUT 1, and the vertical rotor 500 is subordinate to the horizontal rotor 200, and is rotatable 360 degrees in a vertical direction while being rotated 360 degrees in a horizontal direction. Thus, the reference antenna 3 that is at a constant distance from the DUT 1 can measure an RF in a 3-dimensional space while performing transmission and reception with respect to the DUT 1 in all directions.

Hereinafter, the horizontal rotor 200 and the vertical rotor 500 will be specifically described.

As illustrated in FIGS. 2 and 3, the horizontal rotor 200 is rotatable 360 degrees about the shaft part 110 into which the DUT holder 300 is fitted.

The horizontal rotor 200 may include a horizontal rotary plate 210, a rotary plate support 220, and a horizontal rotator 230. The horizontal rotary plate 210 has a through-hole 211 in which the shaft part 110 is disposed. The horizontal rotary plate 210 is formed in a disc shape. The horizontal rotary plate 210 has a plurality of fastening holes 210a. The plurality of fastening holes 210a are for fixing the rotary plate support 220 and a vertical support 510 to be described below.

The rotary plate support 220 is fixed to a lower portion of the horizontal rotary plate 210. The rotary plate support 220 is to distribute a load of a horizontal rotary motor 231 to be described below and rotate the horizontal rotary plate 210 in a balanced way.

A fitting hole 222, which communicates with the through-hole 211 of the horizontal rotary plate 210, is formed in the center of the rotary plate support 220. The shaft part 110 passing through the through-hole 211 passes through the fitting hole 222.

The rotary plate support 220 includes a rotary part 221 and support parts 223. The rotary part 221 has a disc shape, and the multiple support parts 223 are configured to protrude from an upper surface of the rotary part 221. The support parts 223 of the rotary plate support 220 are fixed to the horizontal rotary plate 210. A plurality of fastening holes 223a corresponding to the fastening holes 210a of the horizontal rotary plate 210 are formed in the support parts 223 of the rotary plate support 220. Thus, the rotary plate support 220 may be integrally fixed to the lower portion of the horizontal rotary plate 210 by screwing.

The rotary part 221 and the support parts 223 are made to be able to reduce weight by including multiple lightening holes.

The horizontal rotator 230 is to rotate the rotary plate support 220. Since the horizontal rotary plate 210 is integrally fixed to the rotary plate support 220, the horizontal rotary plate 210 is also rotated if the rotary plate support 220 rotates.

The rotary plate support 220 and the horizontal rotator 230 are disposed between the horizontal rotary plate 210 and an upper surface of the base frame 100, and rotate the horizontal rotary plate 210.

The horizontal rotator 230 includes a horizontal rotary motor 231, a pinion gear 232, and a horizontal rotary gear 233.

The horizontal rotary motor 231 is fixed to the base frame 100 such that a shaft thereof protrudes to the upper surface of the base frame 100. The pinion gear 232 is coupled to the shaft of the horizontal rotary motor 231. The pinion gear 232 is meshed with the horizontal rotary gear 233 that is provided to surround an outer diameter of the rotary plate support 220. The horizontal rotary gear 233 may be formed on an outer diameter of the rotary part 221 of the rotary plate support 220, or be separately made and then be coupled to surround the outer diameter of the rotary part 221. The rotary part 221 coupled with the horizontal rotary gear 233 serves to reinforce strength of the horizontal rotary gear 233 and to transmit rotational power of the horizontal rotary gear 233 to the horizontal rotary plate 210 in a balanced way.

If the horizontal rotary motor 231 is operated, the horizontal rotary gear 233 is rotated while the pinion gear 232 coupled to the shaft of the horizontal rotary motor 231 is rotated. Thus, the horizontal rotary plate 210, which is integrally fixed to the rotary plate support 220, is rotated.

A support plate 240 is further coupled to a bottom of the rotary plate support 220. A communication hole 241 communicating with the fitting hole 222 is formed in the support plate 240. The support plate 240 may be coupled to the bottom of the rotary plate support 220 by screwing.

As illustrated in FIG. 4, the support plate 240 increases an interval between the rotary plate support 220 and the upper surface of the base frame 100 such that the rotary plate support 220 can be smoothly rotated.

The support plate 240 is installed to pass through an installation hole 101 formed in the center of the upper surface of the base frame 100. A fixing plate 120 is further installed on a bottom of the base frame 100. The fixing plate 120 is fixed to the bottom of the base frame 100 by screwing, and has a fixing hole 121 formed to communicate with the communication hole 241 of the support plate 240.

The rotary plate support 220 can be rotated by the support plate 240 that is installed to pass through the installation hole 101 of the base frame 100 and to protrude to the upper surface of the base frame 100, and the shaft part 110 can be fixed to the fixing hole 121 of the fixing plate 120 installed at the lower portion of the base frame 100.

Specifically, the shaft part 110 passes through the through-hole 211 of the horizontal rotary plate 210, the fitting hole 222 of the rotary plate support 220, and the communication hole 241 of the support plate 240, and is fixed to the fixing hole 121 of the fixing plate 120. The through-hole 211 of the horizontal rotary plate 210, the fitting hole 222 of the rotary plate support 220, and the communication hole 241 of the support plate 240 are relatively large compared to an outer diameter of the shaft part 110, and the fixing hole 121 of the fixing plate 120 corresponds to the outer diameter of the shaft part 110. The shaft part 110 can be fixed to the fixing hole 121 of the fixing plate 120 in a fitted way. This prevents rotation of the shaft part 110 even if the horizontal rotary plate 210 is rotated.

As illustrated in FIG. 5, the reference antenna holder 400 is fixed to the vertical rotor 500. The reference antenna 3 for performing transmission and reception with respect to the DUT 1 is held on the reference antenna holder 400.

The vertical rotor 500 is rotatable 360 degrees about the virtual central point lying at the center thereof in the θ direction (the vertical direction). Thus, the reference antenna 3 is rotatable 360 degrees about the DUT 1 in the vertical direction. Because the vertical rotor 500 is subordinate to the horizontal rotor 200, the reference antenna 3 is rotatable 360 degrees about the DUT 1 in the horizontal direction.

The reference antenna holder 400 includes a fastening part 410 that is fixed to the vertical rotor 500 by screwing, an extending part 420 that is perpendicular to the fastening part 410 and extends upward, and a holding part 430 which is perpendicular to the extending part 420 and extends in a direction opposite to the fastening part 410, and on which the reference antenna 3 is vertically held. A holding recess 431, one side of which is open, is formed in the holding part 430, and the reference antenna 3 may be held in a fitted way. The reference antenna 3 is held on the holding part 430 to face the DUT 1 such that a portion thereof from which an RF is radiated is directed downward.

Although not illustrated, the holding part 430 may be slidable up and down and side to side or be rotatable with respect to the extending part 420. The holding part 430 may be configured to be slidable up and down and side to side or be or rotatable with respect to the extending part 420 by additionally coupling a slide, a motor, and accessories to a coupling portion of the holding part 430 and the extending part 420. In this case, the holding part 430 on which the reference antenna 3 is held is slid or rotated at a predetermined angle with respect to the extending part 420, and a position of the reference antenna 3 may be changed and applied.

A plurality of fastening holes 410a and 420a are provided in the fastening part 410 and the extending part 420 such that the reference antenna holder 400 can be screwed on the vertical rotor 500.

Multiple reference antenna holders 400 can be fixed to the vertical rotor 500. For example, an RF measurement test of the DUT 1 may be performed by fixing two reference antenna holders 400 to the vertical rotor 500 at a set interval and fixing the reference antenna 3 to each of the reference antenna holders 400.

As illustrated in FIGS. 6 and 7, the vertical rotor 500 has a structure that includes vertical rotary gear 501, a gear support 502, and a gear reinforcement 503.

The vertical rotary gear 501 has a ring shape, and the gear support 502 is provided to surround an inner diameter of the vertical rotary gear 501. Multiple gear reinforcements 503 may be provided on one surface of the vertical rotary gear 501 in a circumferential direction at regular intervals.

In an embodiment, the vertical rotor 500 is fixed to an inner side of the ring-shaped vertical rotary gear 501 with a partial surface of the ring-shaped gear support 502 overlapped with the vertical rotary gear 501, and the gear reinforcement 503 is attached to a surface opposite to a surface to which the gear support 502 is attached in the vertical rotary gear 501. Strength of the vertical rotary gear 501 is reinforced in a balanced way.

The vertical rotary gear 501, the gear support 502, and the gear reinforcement 503 may be fixed by fastening a plurality of screws at regular intervals. A plurality of fastening holes 502a are circumferentially formed in the gear support 502. The fastening holes 502a formed in the gear support 502 is to fix the reference antenna holder 400. One or more reference antenna holders 400 may be installed on the gear support 502.

A rear surface of the reference antenna holder 400 is spaced apart from the vertical rotor 500 in a state in which the reference antenna holder 400 is installed on the gear support 502. This prevents the reference antenna holder 400 and the vertical support 510 from interfering with each other during rotation of the vertical rotor 500.

As illustrated in FIG. 7, the vertical rotor 500 is rotatably installed on the vertical support 510 fixed to the horizontal rotor 200. The vertical support 510 is fixed to an upper surface of the horizontal rotor 200 so as to be spaced part from a side surface of the shaft part 110 and be perpendicular to the horizontal rotor 200.

The vertical rotor 500 is rotated by a vertical rotator 520 while being supported on the vertical support 510. A disposition space 510a is formed in the middle of the vertical support 510 in a thickness direction, and the vertical support 510 is rotatably installed in the disposition space 510a. The vertical support 510 has a shape with a semicircular inner diameter that is open upward.

As illustrated in FIG. 8, the vertical rotator 520 includes a vertical rotary motor 521, a driving gear 522, a driven gear 523, and a driving belt 524. The driving gear 522 is coupled to a shaft of the vertical rotary motor 521. The vertical rotary motor 521 is installed between the horizontal rotary plate 210 and the upper surface of the base frame 100. A central shaft of the driven gear 523 is supported on the vertical support 510, and the driven gear 523 is meshed with the vertical rotary gear 501. The driving gear 522 and the driven gear 523 are connected by the driving belt 524.

If the vertical rotary motor 521 is operated, the driven gear 523 connected by the driving belt 524 is rotated while the driving gear 522 coupled to the shaft of the vertical rotary motor 521 is rotated, and the vertical rotary gear 501 meshed with the driven gear 523 is rotated. Thus, the vertical rotor 500 is rotated.

The driving gear 522 and the driven gear 523 are connected by the driving belt 524 within the vertical support 510, and are disposed at the same distance from a virtual longitudinal central axis of the vertical rotary gear 501.

A load distribution gear 530 is disposed at a position opposite to the driven gear 523 in symmetry with respect to the virtual longitudinal central axis of the vertical rotary gear 501. The load distribution gear 530 is rotated in mesh with the vertical rotary gear 501. The load distribution gear 530 is adjusted on a level with the driven gear 523, and prevents a load of the vertical rotary motor 521 from leaning to one side such that the vertical rotor 500 is rotated in a balanced way.

A central shaft of the load distribution gear 530 is supported on the vertical support 510. For example, the central shaft of the load distribution gear 530 is inserted into a support hole of the vertical support 510 and, in this state, a finishing pin is coupled to an end of the central shaft passing through the support hole of the vertical support 510. Thereby, the load distribution gear 530 is supported on the vertical support 510, and is rotatable relative to the support hole of the vertical support 510. A central shaft of the driven gear 523 can also be supported on the vertical support 510 in the same way as the load distribution gear 530.

The driving gear 522, the driven gear 523, and the load distribution gear 530 may be formed in the same shape. For example, the driving gear 522, the driven gear 523, and the load distribution gear 530 may be formed of a pinion gear having the same shape.

The driven gear 523 and the load distribution gear 530 are disposed at an angle of 120° or less when intersecting a central point of the vertical rotary gear 501. If the driven gear 523 and the load distribution gear 530 are disposed at an angle of 120° or less when intersecting the central point of the vertical rotary gear 501, the load distribution effect using the load distribution gear 530 is produced. If the angle between the driven gear 523 and the load distribution gear 530 exceeds the angle of 120°, the load distribution effect using the load distribution gear 530 is reduced by half, or is not produced.

As confirmed from FIG. 8, if the horizontal rotary motor 231 is operated, the horizontal rotary gear 233 is rotated while the pinion gear 232 coupled to the shaft of the horizontal rotary motor 231 is rotated, and thus the horizontal rotary plate 210 fixed integrally with the rotary plate support 220 is rotated 360 degrees.

If the vertical rotary motor 521 is operated, the driven gear 523 connected by the driving belt 524 is rotated while the driving gear 522 coupled to the shaft of the vertical rotary motor 521 is rotated, and the vertical rotary gear 501 meshed with the driven gear 523 is rotated. Thus, the vertical rotor 500 is rotated.

Due to the state in which the vertical rotor 500 is installed on the vertical support 510 and the vertical support 510 is fixed to the horizontal rotary plate 210, the vertical rotor 500 is rotatable in a vertical direction while being rotated in a horizontal direction.

A radius of the vertical rotor 500 may be defined on the basis of a radius value of the vertical rotor 500.

The DUT holder 300 may be replaced depending on the radius of the vertical rotor 500. A length of the replaced DUT holder 300 may be adjusted such that a DUT held on the DUT holder 300 is located at a central point of rotation of the vertical rotor 500.

As illustrated in FIGS. 1, 9, and 10, the vertical support 510 is made up of a first support plate 511 and a second support plate 512 which are spaced apart from each other, between which the disposition space 510a in which the vertical rotor 500 is rotatably disposed is formed, and which are shaped to surround a part of the vertical rotary gear 501.

That is, the first support plate 511 and the second support plate 512 are formed in a semicircular shape whose upper portion is open so as to surround a part of the vertical rotary gear 501. The semicircular shapes of the first support plate 511 and the second support plate 512 have larger inner diameters than the gear support 502 so that the gear support 502 is not surrounded in the vertical rotor 500. Thus, interference between the reference antenna holder 400 and the vertical support 510 installed on the gear support 502 can be prevented.

Guide recesses 513 and 514 recessed in directions opposite to each other are formed in the first and second support plates 511 and 512. The guide recesses 513 and 514 become passages along which the gear reinforcement 503 moves without interference during rotation of the vertical rotor 500. The gear reinforcement moves in such a way that the gear reinforcement passes through the guide recesses 513 and 514 503 during rotation of the vertical rotor 500.

In an embodiment, the gear reinforcement 503 moves through the guide recess 513 formed in the first support plate 511, and the gear support 502 moves through the guide recess 514 formed in the second support plate 512, so that the vertical rotor 500 can be stably rotated in the disposition space 510a between the first support plate 511 and the second support plate 512.

In an embodiment, the remaining components excluding the horizontal rotary motor 231 and the vertical rotary motor 521 are all made of a nonmetallic material for accurate measurement of an RF. When the components are made of a nonmetallic material, the accurate measurement of the RF is possible because an influence of reflected waves of signals transmitted when the RF is measured is prevented. However, the horizontal rotor 200 may be made of an aluminum material.

Further, the horizontal rotary motor 231 and the vertical rotary motor 521 are disposed between the horizontal rotary plate 210 and the upper surface of the base frame 100, and powers thereof are transmitted to one side of the horizontal rotary plate and one side of the vertical rotor using gears so as to enable the horizontal rotary plate and the vertical rotor to be rotated 360 degrees without interference.

Meanwhile, the base frame 100 may include a control panel that controls horizontal rotation and vertical rotation of the horizontal rotor 200 and the vertical rotor 500. The control panel may control rotational operations of the horizontal rotary motor 231 and the vertical rotary motor 521. A setting part that sets a control operation of the control panel may be provided. The setting part may be a setting button provided to the control panel, or a remote control that can perform the control operation of the control panel through wireless communication with the control panel.

Hereinafter, an operation and actions of the present disclosure will be described.

According to the present disclosure, as illustrated in FIG. 2, if the horizontal rotary motor 231 is operated, the horizontal rotary gear 233 is rotated while the pinion gear 232 coupled to the shaft of the horizontal rotary motor 231 is rotated. Thus, the horizontal rotary plate 210 fixed integrally with the rotary plate support 220 is rotated 360 degrees.

If the vertical rotary motor 521 is operated, the driven gear 523 connected by the driving belt 524 is rotated while the driving gear 522 coupled to the shaft of the vertical rotary motor 521 is rotated, and the vertical rotary gear 501 meshed with the driven gear 523 is rotated. Thus, the vertical rotor 500 is rotated.

Due to the state in which the vertical rotor 500 is installed on the vertical support 510 and the vertical support 510 is fixed to the horizontal rotary plate 210, the vertical rotor 500 can be rotated in a vertical direction while being rotated in a horizontal direction.

As illustrated in FIG. 1, the vertical rotor 500 is rotated 360 degrees about the virtual central point lying at the center thereof in the θ direction (the vertical direction) while the horizontal rotor 200 is rotated 360 degrees about the shaft part 110 in the x direction (the horizontal direction).

In this process, the reference antenna 3 is installed on the vertical rotor 500 and is rotated, and thus can measure an RF while performing transmission and reception with respect to the DUT 1 in all directions at a constant distance from the DUT 1.

In this case, because the DUT holder 300 to which the DUT 1 is fixed is not rotated even if the horizontal rotor is rotated, accuracy of the RF measurement can be increased.

Further, the DUT holder can be detached or attached from or to the shaft part, and the reference antenna can also be detached or attached from or to the reference antenna holder. For this reason, depending on a condition to be measured, the reference antenna can be changed, and the DUT holder can also be changed. In addition, depending on a frequency and DUT 1 to be measured, the horizontal rotary plate and the vertical rotor can be replaced. In this case, a radius of the vertical rotor can be defined on the basis of a radius value of the vertical rotor.

Because the above-described present disclosure is configured to enable extension and replacement depending on the frequency to be measured and to minimize an influence of reflected waves at the time of the RF measurement, antenna performance can be simply tested in an anechoic chamber or a semi-anechoic chamber.

Optimal embodiments of the present disclosure have been disclosed in the drawings and the specification. Although specific terms have been used herein, these terms are merely intended to describe the present disclosure, and are not intended to limit the meanings thereof or the scope of the present disclosure described in the claims. Therefore, those having ordinary knowledge in the art will understand that various modifications and other equivalent embodiments from the embodiments are possible. Therefore, the genuine technical scope of the present disclosure should be defined by the technical spirit of the attached claims.

The invention claimed is:

1. An antenna performance tester comprising:
   a horizontal rotor which is installed at an upper portion of a base frame, is configured such that a shaft part is disposed in the center thereof, and is rotatable about the shaft part;
   a DUT holder detachably coupled to an upper portion of the shaft part and configured such that a device under test is held on an upper end thereof;
   a reference antenna holder on which a reference antenna for performing transmission and reception with respect to the device under test held on the DUT holder is held; and a vertical rotor to which the reference antenna holder is detachably fixed and which is spaced apart from a side surface of the DUT holder, is installed perpendicular to the horizontal rotor, and is rotatable about a virtual central point lying at the center thereof, wherein the vertical rotor is rotatably installed on a vertical support that is spaced apart from a side surface of the shaft part and is fixed to an upper surface of the horizontal rotor so as to be perpendicular to the horizontal rotor; and is rotated by a vertical rotator, and wherein the vertical rotor includes:

a ring-shaped vertical rotary gear;

a gear support provided to surround an inner diameter of the vertical rotary gear; and multiple gear reinforcements circumferentially provided on one surface of the vertical rotary gear at regular intervals.

2. The antenna performance tester of claim 1, wherein the horizontal rotor includes:

a horizontal rotary plate in which a through-hole for disposing the shaft part is formed;

a rotary plate support which is fixed to a lower portion of the horizontal rotary plate and in the center of which a fitting hole which communicates with the through-hole and into which the shaft part is fitted is formed; and a horizontal rotator for rotating the rotary plate support.

3. The antenna performance tester of claim 2, wherein the horizontal rotator includes:

a horizontal rotary motor;

a pinion gear coupled to a shaft of the horizontal rotary motor; and a horizontal rotary gear provided to surround an outer diameter of the rotary plate support and meshed with the pinion gear.

4. The antenna performance tester of claim 1, wherein the vertical support includes:

first and second support plates which are spaced apart from each other, between which a disposition space in which the vertical rotor is rotatably disposed is formed, and which is formed to surround a part of the vertical rotary gear; and guide recesses formed in the first and second support plates so as to enable the gear reinforcements to move without interference during rotation of the vertical rotary gear.

5. The antenna performance tester of claim 1, wherein the vertical rotator includes:

a vertical rotary motor;

a driving gear that is coupled to a shaft of the vertical rotary motor;

a driven gear that has a central shaft coupled to the vertical support and is meshed with the vertical rotary gear; and a driving belt that connects the driving gear and the driven gear.

6. The antenna performance tester of claim 5, wherein a load distribution gear is disposed at a position opposite to the driven gear in symmetry with respect to a longitudinal central axis of the vertical rotary gear, and is meshed with the vertical rotary gear.

7. The antenna performance tester of claim 6, wherein the driven gear and the load distribution gear are disposed at an angle of 120° or less when intersecting a central point of the vertical rotary gear.

8. The antenna performance tester of claim 1, wherein the reference antenna holder includes:

a fastening part that is fixed to the vertical rotor by screwing;

an extending part that is perpendicular to the fastening part and extends upward; and a holding part which is perpendicular to the extending part and in which a holding recess which extends in a direction opposite to the fastening part and in which the reference antenna is vertically held is formed.

9. The antenna performance tester of claim 8, wherein the holding part is slidable up and down and side to side or is rotatable with respect to the extending part.

10. The antenna performance tester of claim 1, wherein multiple reference antenna holders including the reference antenna holder are fixable to the vertical rotor.

11. The antenna performance tester of claim 2, wherein the shaft part is configured to prevent rotation in such a way that an end thereof passes through the through-hole of the horizontal rotary plate and is fixed to a fixing plate fixed to a bottom of the base frame.

12. The antenna performance tester of claim 1, comprises:

a control panel configured to control horizontal rotation and vertical rotation of the horizontal rotor and the vertical rotor; and a setting part configured to set operations of the control panel.

* * * * *